(12) United States Patent
Lee et al.

(10) Patent No.: US 10,424,260 B2
(45) Date of Patent: Sep. 24, 2019

(54) DISPLAY DEVICE (71) Applicant: SAMSUNG DISPLAY CO., LTD., Yongin-si, Gyeonggi-Do (KR)

(72) Inventors: Jeong Doo Lee, Yongin-si (KR); Sang Jun Park, Yongin-si (KR); Sung Jun Kim, Yongin-si (KR); Sung Yup Kim, Yongin-si (KR); Mi Young Park, Yongin-si (KR); Hee Bum Park, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/793,258

(22) Filed: Oct. 25, 2017

(65) Prior Publication Data

US 2018/0137830 A1 May 17, 2018

(30) Foreign Application Priority Data

Nov. 11, 2016 (KR) .................. 10-2016-0150211

(51) Int. Cl.
*G09G 5/02* (2006.01)
*G09G 3/36* (2006.01)
*G09G 3/20* (2006.01)
*H01L 27/32* (2006.01)

(52) U.S. Cl.
CPC ......... *G09G 3/3655* (2013.01); *G09G 3/2074* (2013.01); *G09G 3/3607* (2013.01); *G09G 3/3614* (2013.01); *G09G 2300/0426* (2013.01); *G09G 2300/0443* (2013.01); *G09G 2300/0452* (2013.01); *G09G 2360/16* (2013.01); *H01L 27/3213* (2013.01)

(58) Field of Classification Search
USPC .................. 345/694, 76, 187, 691, 690, 214
See application file for complete search history.

(56) References Cited

U.S. PATENT DOCUMENTS

| | | | |
|---|---|---|---|
| 2005/0190127 A1* | 9/2005 | Tomohara | G09G 3/20 345/76 |
| 2008/0246780 A1* | 10/2008 | Cho | G02F 1/133602 345/690 |
| 2012/0113379 A1* | 5/2012 | Tomizawa | G09G 3/3607 349/187 |
| 2012/0249507 A1 | 10/2012 | Chung et al. | |
| 2012/0249616 A1* | 10/2012 | Komatsu | G09G 3/3688 345/691 |

(Continued)

*Primary Examiner* — Thuy N Pardo
(74) *Attorney, Agent, or Firm* — F. Chau & Associates, LLC (57) ABSTRACT A display device includes a plurality of pixels, each including a first sub-pixel indicating a first color, a second sub-pixel indicating a second color, and a third sub-pixel indicating a third color, data lines coupled to pixels arranged in a first direction and configured to supply a data signal to the coupled pixels, gate lines coupled to pixels arranged in a second direction crossing the first direction and configured to supply a gate signal to the coupled pixels, and a compensation circuit configured to calculate a difference between grayscale values of a data signal to be supplied to the first to third sub-pixels, and generate a clock signal based on the difference that controls a start time at which the data signal is inputted to the pixels.

20 Claims, 6 Drawing Sheets

(56) References Cited

U.S. PATENT DOCUMENTS

| | | | |
|---|---|---|---|
| 2014/0049568 A1* | 2/2014 | Qi | G09G 3/3258 345/690 |
| 2015/0194105 A1* | 7/2015 | Han | G02F 1/1309 345/690 |
| 2015/0194117 A1* | 7/2015 | Cho | G09G 3/3685 345/691 |
| 2015/0221275 A1* | 8/2015 | Shin | G09G 3/3648 345/214 |
| 2015/0356922 A1* | 12/2015 | Zhu | G09G 3/3291 345/76 |
| 2016/0041434 A1* | 2/2016 | Qin | G02F 1/134309 345/694 |
| 2016/0240138 A1* | 8/2016 | Xu | G09G 3/32 345/694 |
| 2017/0116920 A1* | 4/2017 | Kwon | G09G 3/3266 345/694 |

* cited by examiner

DISPLAY DEVICE

CROSS-REFERENCE TO RELATED APPLICATION

The present application claims priority to Korean patent application no. 10-2016-0150211 filed on Nov. 11, 2016, the disclosure of which is incorporated by reference in its entirety herein.

BACKGROUND

1. Technical Field

Exemplary embodiments of the present invention relate to a display device.

2. Discussion of Related Art

Research into and commercialization of a lightweight flat panel display (FPD) that replaces a cathode ray tube (CRT) has increased due to the increasing demand for portable devices.

A liquid crystal display (LCD) is an example of such a FPD. The LCD is a device for displaying an image using optical anisotropy of liquid crystals. The LCD has been actively applied to notebook computers, desktop monitors, and tablet computers because it has excellent resolution, can display numerous colors, and has other excellent image quality characteristics.

SUMMARY

At least one embodiment of the present invention is directed to a liquid crystal display (LCD) that has improved luminance uniformity.

According to an exemplary embodiment of the present invention, a display device is provided that includes pixels, each including a first sub-pixel indicating a first color, a second sub-pixel indicating a second color, and a third sub-pixel indicating a third color, data lines coupled to the pixels arranged in a first direction and configured to supply a data signal to the coupled pixels, gate lines coupled to the pixels arranged in a second direction crossing the first direction and configured to supply a gate signal to the coupled pixels, and a compensation circuit configured to calculate a difference between grayscale values of a data signal to be supplied to the first to third sub-pixels, and generate a clock signal based on the difference that controls a start time at which the data signal is inputted to the pixels.

In an embodiment, the first sub-pixel is coupled to an i−1-th gate line, the second sub-pixel is coupled to an i-th gate line, and the third sub-pixel is coupled to an i+1-th gate line, where i is a natural number greater than 0.

In an embodiment, the first sub-pixel, the second sub-pixel, and the third sub-pixel is coupled to a same one of the data lines.

In an embodiment, the compensation circuit includes a comparator configured to calculate differences between a first grayscale value of a data signal to be supplied to the first sub-pixel, a second grayscale value of a data signal to be supplied to the second sub-pixel, and a third grayscale value of a data signal to be supplied to the third sub-pixel, and a signal generator configured to generate the clock signal based on the differences.

In an embodiment, when the second grayscale value is greater than the first grayscale value by a preset value or more, a charging time of the data signal supplied to the first sub-pixel is shorter than 1 horizontal time period, and a charging time of the data signal supplied to the second sub-pixel is longer than the 1 horizontal time period.

In an embodiment, a charging time of the data signal supplied to the third sub-pixel has a length corresponding to the 1 horizontal time period.

In an embodiment, when the third grayscale value is greater than the second grayscale value by a preset value or more, a charging time of the data signal supplied to the third sub-pixel is longer than 1 horizontal time period, and a charging time of the data signal supplied to at least one of the first sub-pixel and the second sub-pixel is shorter than the 1 horizontal time period.

In an embodiment, a charging time of a data signal supplied to each pixel has a length corresponding to 3 horizontal time periods.

In an embodiment, the clock signal includes ON signals, and the signal generator is configured to adjust an interval between the ON signals of the clock signal based on the differences.

In an embodiment, the signal generator is configured to, when the data signal is supplied to the pixels in a normal mode, output the ON signals of the clock signal at intervals of the 1 horizontal time period, and when the data signal is supplied to the pixels in a luminance compensation mode, output at least two of the ON signals before the 1 horizontal time period elapses.

In an embodiment, the comparator is configured to determine that a current mode is the luminance compensation mode if the second grayscale value is greater than the first grayscale value by a preset value or more, or if the third grayscale value is greater than the second grayscale value by the preset value or more.

In an embodiment, when, among the ON signals of the clock signal, an i−1-th ON signal is outputted, the first grayscale value is charged in the first sub-pixel, when an i-th ON signal is outputted, the second grayscale value is charged in the second sub-pixel, and when an i+1-th ON signal is outputted, the third grayscale value is charged in the third sub-pixel, and as a difference between the second grayscale value and the first grayscale value becomes larger, a time at which the i-th ON signal is outputted becomes earlier, where i is a natural number greater than 1.

In an embodiment, the i+1-th ON signal is outputted after 2 horizontal time periods have elapsed from a time at which the i−1-th ON signal is outputted.

In an embodiment, when the third grayscale value is greater than the second grayscale value by the preset value or more, the i+1-th ON signal is outputted before 1 horizontal time period elapses from the time at which the i-th ON signal is outputted.

In an embodiment, when the third grayscale value is greater than the second grayscale value by the preset value or more, the i-th ON signal is outputted before 1 horizontal time period elapses from a time at which the i−1-th ON signal is outputted.

According to an exemplary embodiment of the invention, a display driving apparatus is provided for driving a display device. The display device includes a pixel having first and second sub-pixels connected to a data line. The display driving apparatus includes a compensation circuit and a data driver. The compensation circuit is configured to set a first duration between first and second pulses of a clock signal to a horizontal period when a first difference between a first grayscale and a second grayscale is less than a preset value, and set the first duration less than the horizontal period when the first difference is greater than or equal the preset value. The data driver is configured to apply a first data signal based on the first grayscale to the data line in response to the first pulse and apply a second data signal based on the second grayscale to the data line in response to the second pulse.

In an embodiment, the first sub-pixel is configured to emit light of a first color and the second sub-pixel is configured to emit light of a second color different from the first color.

In an embodiment, the first sub-pixel is connected to a first gate line and the second sub-pixel is connected to a second gate line, where the horizontal period is a time period from the time at which a first gate signal is outputted to the time at which a second gate signal is output to the second gate line.

In an embodiment, the pixel includes a third sub-pixel connected to the data line, the compensation circuit is configured to set a second duration between the second pulse and a third pulse of the clock signal greater than the one horizontal period when a second difference between the second grayscale and a third grayscale is greater than or equal the preset value, and the data driver is configured to apply a third data signal based on the third grayscale to the data line in response to the third pulse.

In an embodiment, the third sub-pixel is configured to emit light of a third color different from the first and second colors.

DETAILED DESCRIPTION OF THE EXEMPLARY EMBODIMENTS

Hereinafter, exemplary embodiments of the present invention will be described in detail with reference to the accompanying drawings. However, the present invention is not limited to the following exemplary embodiments, and may be implemented in various different forms. In the following description, when it is described that an element is "coupled" to another element, the element may be "directly coupled" to the other element or "electrically coupled" to the other element through a third element. It should be noted that the same reference numerals are used to designate the same or similar elements throughout the drawings.

Hereinafter, an LCD and a method of driving the LCD in accordance with exemplary embodiments of the present invention will be described with reference to the attached drawings.

Figure 1:
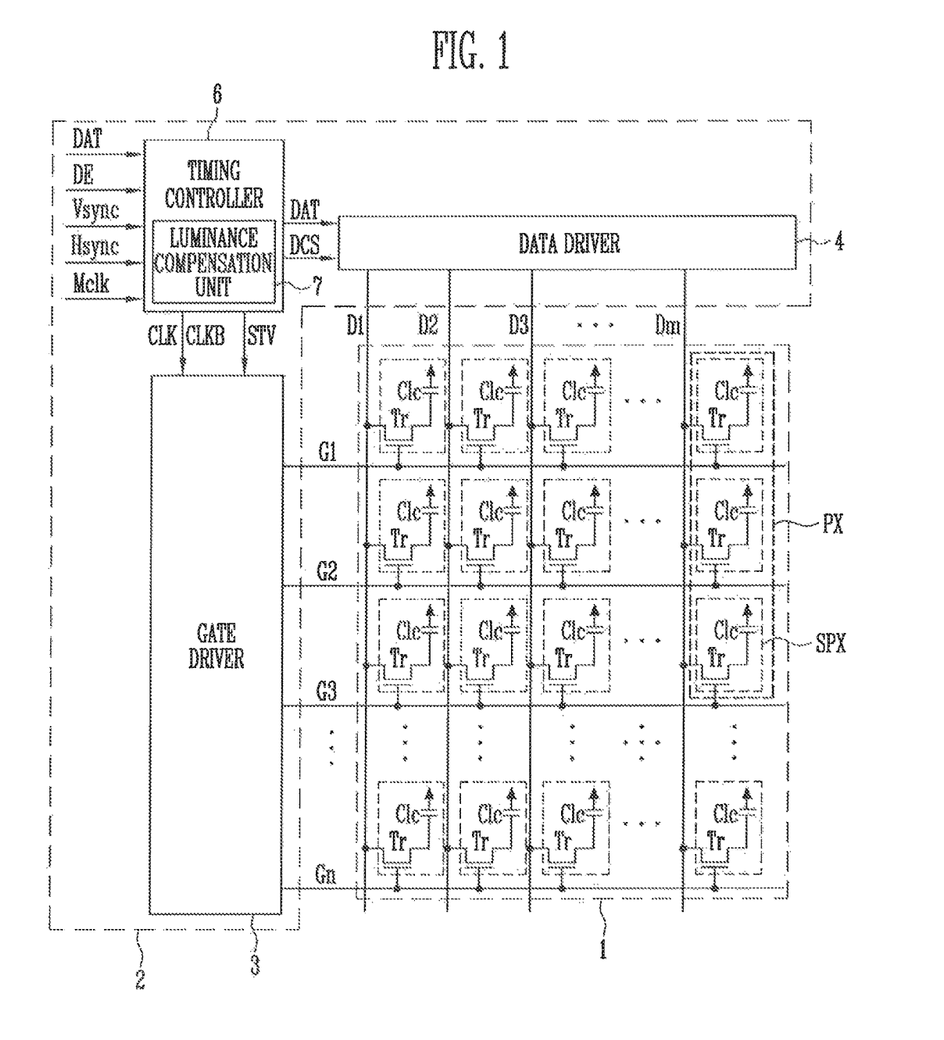
FIG. 1 is a block diagram illustrating an LCD according to an exemplary embodiment of the present invention.
Figure 2:
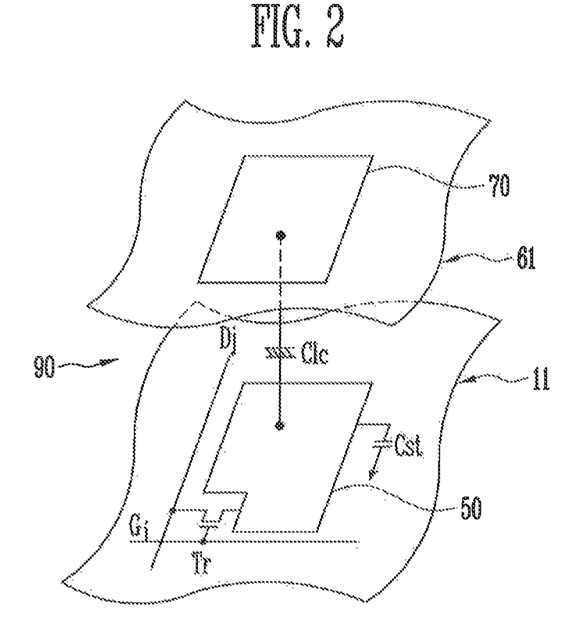
FIG. 2 is an equivalent circuit diagram of a pixel illustrated in FIG. 1.
Figure 3:
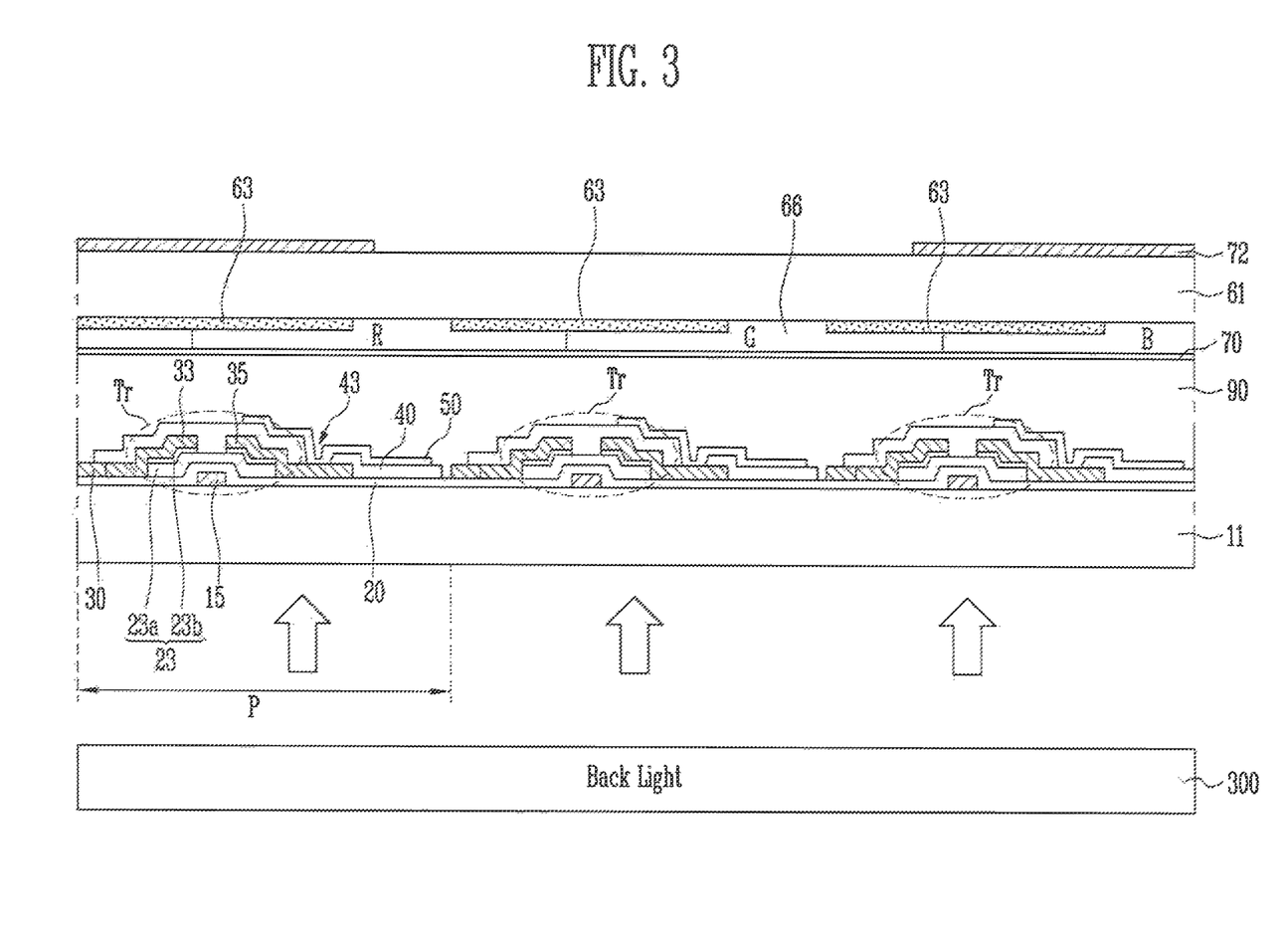
FIG. 3 is a sectional view illustrating a certain region of an LCD in accordance with an exemplary embodiment of the present invention.

FIG. 1 is a block diagram illustrating an LCD according to an exemplary embodiment of the present invention. FIG. 2 is an equivalent circuit diagram of a pixel illustrated in FIG. 1, and FIG. 3 is a sectional view illustrating a certain region of the LCD according to an exemplary embodiment of the present invention.

As illustrated in FIG. 1, the LCD according to an embodiment of the present invention includes a display panel 1 and a display driving unit 2 (e.g., a display driving circuit) for driving the display panel 1.

The display panel 1 includes a plurality of pixels PX, each including a plurality of sub-pixels SPX. While each pixel PX is depicted in FIG. 1 as including 3 sub-pixels SPX, embodiments of the inventive concept are not limited thereto. For example, in alternate embodiments, each pixel PX may include less than 2 or greater than 3 sub-pixels SPX.

The pixels PX are elements for displaying unit images that constitute an image, and the resolution of the display panel 1 may be determined depending on the number of pixels PX provided in the display panel 1.

The display panel 1 includes a plurality of gate lines G1 to Gn arranged in a first direction (e.g., horizontal direction) and a plurality of data lines D1 to Dm arranged in a second direction (e.g., vertical direction) that crosses the first direction.

Each of the sub-pixels SPX may be coupled to any one of the plurality of gate lines GL1 to GLn and any one of the plurality of data lines DL1 to DLm and may then be driven.

The display driving unit 2 according to an exemplary embodiment includes a gate driver 3 (e.g., a gate driving circuit) for supplying a gate signal to the gate lines G1 to Gn, a data driver 4 (e.g., a data driving circuit) for supplying a data signal to the data lines D1 to Dm, and a timing controller 6 (e.g., a timing control circuit) for controlling the gate driver 3 and the data driver 4.

The LCD is a display device for implementing an image using optical anisotropy and polarization properties of liquid crystals. The liquid crystals may have a thin and long molecular structure. In an embodiment, the liquid crystals have optical anisotropy in which molecular arrangement of the liquid crystals is directionally oriented, and polarization properties in which the direction of molecular arrangement of the liquid crystals changes depending on the size of the liquid crystals when the liquid crystals are placed in an electric field.

In an embodiment, the LCD includes a liquid crystal panel. In this embodiment, the liquid crystal panel is configured to include a first substrate and a second substrate attached to each other with pixel electrodes, common electrodes, and a liquid crystal layer interposed between the first and second substrates. A predetermined electric field is formed in the LCD to display an image by applying a data signal and a common voltage between the pixel electrodes PX and the common electrodes of the sub-pixels SPX selected in response to a gate signal, and adjusting the transmittance of light supplied from a backlight depending on the arrangement angle of liquid crystals of the LCD that are changed due to the electric field.

Modes for such an LCD may include a Twisted Nematic (TN) mode, a Vertical Alignment (VA) mode, an In Plane Switching (IPS) mode, and a Plane to Line Switching (PLS) mode depending on the scheme for adjusting the arrangement angle of the liquid crystals.

Among the modes, the IPS mode and the PLS mode are schemes in which both a pixel electrode 50 and a common electrode 70 are arranged on a lower substrate (e.g., a first substrate 11), thus enabling the arrangement of the liquid crystals to be adjusted by an electric field between the pixel electrode 50 and the common electrode 70.

Although an embodiment in which the common electrode 70 is disposed on a second substrate 61 is illustrated in FIG. 2, it is apparent that the present disclosure may also be applied to the IPS mode and the PLS mode in which the common electrode 70, together with the pixel electrode 50, is disposed on the first substrate 11.

Referring to the embodiments illustrated in FIGS. 2 and 3, the LCD may have a configuration in which the first substrate 11 and the second substrate 61 are attached to each other while facing each other, with a liquid crystal layer 90 being interposed therebetween.

In the above configuration, the gate lines G1 to Gn and the data lines D1 to Dm that cross vertically and horizontally may be arranged on the first substrate 11 that is a lower substrate, and transistors Tr may be provided at intersections of the gate lines G1 to Gn and the data lines D1 to Dm and may be coupled to pixel electrodes 50 formed in respective sub-pixels SPX in a one-to-one correspondence.

When this configuration is described in detail with reference to FIG. 2, a sub-pixel SPX coupled to an i-th gate line Gi and a j-th data line Dj may include a transistor Tr coupled to the i-th gate line Gi and the j-th data line Dj, a pixel electrode 50 coupled to the transistor Tr, a liquid crystal capacitor Clc disposed between the pixel electrode 50 and a common electrode 70, and a storage capacitor Cst.

Here, i may be a natural number of n or less, and j may be a natural number of m or less.

Here, the storage capacitor Cst may be omitted according to circumstances.

In the embodiment illustrated in FIG. 3, the transistor Tr includes a gate electrode 15 coupled to a gate line, source/drain electrodes 33 and 35, and a semiconductor layer 23 formed between the gate electrode 15 and the source/drain electrodes 33 and 35. In an embodiment, the semiconductor layer 23 includes an active layer 23a and an ohmic contact layer 23b.

In an embodiment, a gate insulating layer 20 is formed on the gate electrode 15, and a protective layer 40 is formed on the source/drain electrodes 33 and 35. A contact hole 43 that allows the drain electrode 35 to be exposed may be provided in the protective layer 40.

In an embodiment, a pixel electrode 50 is formed on the protective layer 40 and is coupled to the drain electrode 35 through the contact hole 43.

However, the structure of the transistor Tr is not limited to that illustrated in FIG. 3, and may be modified into other structures.

The liquid crystal capacitor Clc includes two terminals. The pixel electrode 50 may correspond to a first one of the two terminals and the common electrode 70 of the second substrate 61 may correspond to a second one of the two terminals. In an embodiment, the liquid crystal layer 90 between the two electrodes 50 and 70 functions as a dielectric substance.

A black matrix 63 that encloses the area of each sub-pixel SPX to cover a non-display area, such as the area of the gate lines G1 to Gn, the data lines D1 to Dm, and the transistor Tr, may be formed on a rear surface of the second substrate 61. In an embodiment, the black matrix 63 is lattice-shaped. In an embodiment, light cannot pass through the black matrix 63.

In an embodiment, color filter patterns 66 arranged to correspond to respective sub-pixels SPX are present inside the black matrix 63, and a plurality of common electrodes 70 are present beneath the color filter patterns 66. In an embodiment, portions of the black matrix 63 are disposed inside the color filter patterns 66. In an embodiment, each of the color filters 66 includes a first recess spaced apart from a second recess, a first portion of the black matrix 63 is disposed within the first recess, a second portion of the black matrix 63 is disposed within the second recess, and the first and second portions are spaced apart from one another.

Here, the color filter patterns 66 may include red, green, and blue color filter patterns R, G, and B that are sequentially and repeatedly arranged. In an embodiment, the red filter prevents light other than red light from passing therethrough. In an embodiment, the green filter prevents light other than green light from passing therethrough. In an embodiment, the blue filter prevents light other than blue light from passing therethrough.

In an embodiment, an overcoat layer (not illustrated) is further formed between the color filter patterns 66 and the common electrodes 70. In an embodiment, the overcoat layer includes an organic polymer. +In an embodiment, the overcoat layer includes at least one of polysilsesquioxane, polysilazane, or derivatives thereof.

Furthermore, since the locations of the black matrix 63 and the color filter patterns 66 may be changed, each common electrode 70 may be formed on an inner surface of the second substrate 61 when the black matrix 63 and the color filter patterns 66 are formed at other locations. For example, a portion of the second substrate 61 may directly contact a portion of common electrode 70.

The common electrode 70 may be made of a transparent conductive material, but may also be made of another type of conductive material such as an opaque metal material.

For example, the common electrode 70 may be made of indium tin oxide (ITO), indium zinc oxide (IZO), graphene, carbon nanotube, or silver nanowires (AgNWs).

Although an embodiment in which the common electrode 70 is positioned on the second substrate 61 is illustrated in FIG. 2, the common electrode 70 may also be positioned on the first substrate 11 other than the second substrate 61.

Here, the common electrode 70 may be formed in a layer identical to or different from that of the pixel electrode 50 depending on a liquid crystal mode.

In addition, a back light 300 for providing light may be positioned below the first substrate 11.

An image display operation of the LCD having the above-described configuration will be described below.

When a gate-on signal is applied to the gate electrode 15 of the transistor Tr provided in each sub-pixel SPX, the active layer 23a is activated. Then, the source electrode 33 transfers a data signal, applied from a data line 30 coupled thereto, to the drain electrode 35 spaced apart therefrom by a predetermined interval via the active layer 23a below the source electrode 33.

Here, since the drain electrode 35 is electrically coupled to the pixel electrode 50 through the contact hole 43, the voltage of the data signal may be applied to the pixel electrode 50 and may be stored in the storage capacitor Cst provided in each sub-pixel SPX.

Then, the arrangement of liquid crystal molecules between the pixel electrode 50 and the common electrode 70 is adjusted in accordance with a voltage corresponding to the difference between a voltage applied to the pixel electrode 50 and a voltage applied to the common electrode 70, thus enabling a predetermined image to be displayed.

The timing controller 6 may receive an externally inputted image signal DAT and input control signals required to control the display of the image signal DAT, may process the image signal DAT to meet an operating condition, and may then provide the processed image signal to the data driver 4.

The timing controller 6 may provide a data control signal DCS, together with the image signal DAT, to the data driver 4.

For example, the timing controller 6 may receive input control signals such as a vertical synchronization signal Vsync, a horizontal synchronization signal Hsync, a main clock signal Mclk, and a data enable signal DE, and may then output the data control signal DCS.

For example, the data control signal DCS may include a clock signal HCLK that is a signal for controlling the start of input of the data signal, a polarity control signal POL, etc.

Accordingly, the data driver 4 may be provided with the image signal DAT and the data control signal DCS, and may supply a data signal corresponding to the image signal DAT to each of data lines D1 to Dm.

For example, the data driver 4 may supply the data signal to the pixels P in synchronization with the gate-on signal.

Meanwhile, the timing controller 6 may provide the gate driver 3 with a first clock signal CLK and a second clock signal CLKB for controlling the gate driver 3. The first clock signal CLK may include a plurality of clock signals, and the second clock signal CLKB may also include a plurality of clock signals. In an embodiment, the second clock signal CLKB is an inverted form of the first clock signal CLK.

In an embodiment, the timing controller 6 supplies the gate driver 3 with a scan start signal STV, together with the clock signals CLK and CLKB.

The gate driver 3 may receive the clock signals CLK and CLKB and the scan start signal STV from the timing controller 6 and may then supply a gate signal to the gate lines G1 to Gn.

The gate signal outputted from the gate driver 3 may include a gate-on signal that is capable of turning on the transistor Tr included in the sub-pixel SPX and a gate-off signal Goff that is capable of turning off the transistor Tr.

For example, the gate driver 3 may sequentially supply the gate-on signal to the gate lines G1 to Gn.

Therefore, when the gate-on signal is sequentially supplied to the gate lines G1 to Gn, pixels P may be sequentially selected for each line, and the selected pixels P may be supplied with data signals that are transferred from the data lines D1 to Dm.

In an embodiment, the first clock signal CLK and the second clock signal CLKB have phases opposite to each other.

In an embodiment, the timing controller 6 includes a luminance compensation unit 7 (e.g., a compensation circuit).

The luminance compensation unit 7 may adjust charging time of a data signal for each horizontal line (e.g., a row of pixels) by analyzing the image signal DAT. That is, the luminance compensation unit 7 may compensate for luminance deviation attributable to the difference between grayscale values of the sub-pixels SPX by shortening or lengthening the charging time of a data signal for each horizontal line.

The configuration and functionality of the luminance compensation unit 7 in accordance with an embodiment of the present invention will be described in detail below.

Although the luminance compensation unit 7 is illustrated as being included in the timing controller 6 in FIG. 1, embodiments of the present invention are not limited thereto. For example, the luminance compensation unit 7 may be formed separately from the timing controller 6 and may also transfer a signal for controlling the charging time of a data signal for each horizontal line to the timing controller 6 or to the data driver 4.

Figure 4:
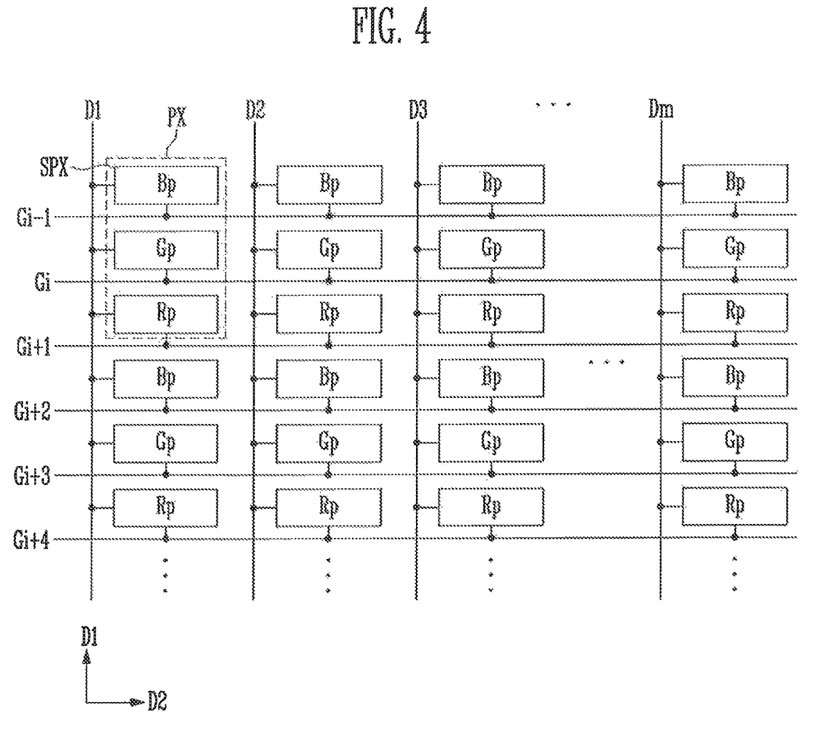
FIG. 4 is a diagram illustrating arrangement of sub-pixels in a display panel illustrated in FIG. 1.

FIG. 4 is a diagram illustrating the arrangement of sub-pixels in the display panel illustrated in FIG. 1.

Referring to FIG. 4, sub-pixels SPX may include red sub-pixels Rp for indicating a red color, green sub-pixels Gp for indicating a green color, and blue sub-pixels Bp for indicating a blue color.

The sub-pixels SPX may be arranged along a first direction D1 and a second direction D2 (in a matrix form).

However, the display panel 1 in embodiments of the present invention is not limited thereto, but may further include sub-pixels for indicating a white color, a yellow color, a cyan color, and a magenta color.

Each pixel PX may include a red sub-pixel Rp, a green sub-pixel Gp, and a blue sub-pixel Bp, and the sub-pixels SPX included in each pixel PX may be arranged along the first direction D1.

That is, the same data line may be coupled to the sub-pixels SPX included in each pixel PX, and three gate lines may be coupled to the sub-pixels SPX, respectively. For example, a first gate line Gi−1 may be coupled to a blue sub-pixel Bp of a pixel PX, a second gate line Gi may be coupled to a green sub-pixel Gp of the pixel PX, and a third gate line Gi+1 may be coupled to a red sub-pixel Rp of the pixel PX.

The sub-pixels SPX may indicate luminance represented by a grayscale included in the data signal transferred through the data lines D1 to Dm.

Although it is illustrated in FIG. 4 that sub-pixels SPX indicating the same color are positioned on the same horizontal line, embodiments of the present invention are not limited thereto, and the locations of the sub-pixels SPX may be changed in various forms.

Hereinafter, the configuration and functionality of the luminance compensation unit in accordance with an embodiment of the present invention will be described in detail with reference to FIGS. 5 to 7.

Figure 5:
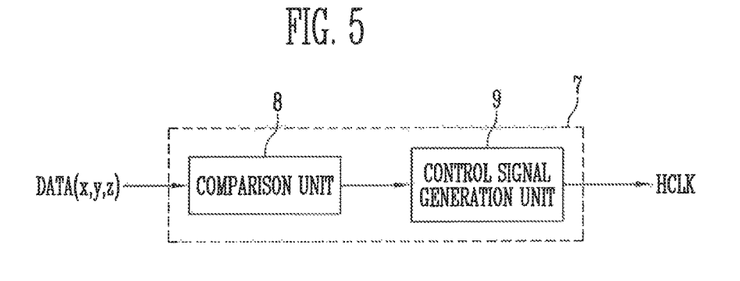
FIG. 5 is a block diagram schematically illustrating a luminance compensation unit according to an exemplary embodiment of the present invention.

FIG. 5 is a block diagram schematically illustrating a configuration of the luminance compensation unit according to an exemplary embodiment of the present invention. Further, FIGS. 6 and 7 are diagrams illustrating examples of a waveform of a clock signal generated by the luminance compensation unit and a data signal supplied in response to the clock signal. In particular, in FIGS. 6 and 7, part of a first data signal DS1 that is supplied to one pixel through the first data line D1 illustrated in FIG. 4 is illustrated.

Referring to FIG. 5, the luminance compensation unit 7 according to an exemplary embodiment of the present invention includes a comparison unit 8 (e.g., a comparator) and a control signal generation unit 9 (e.g., signal generator).

First, the comparison unit 8 may perform a function of analyzing the grayscale value DATA (x, y, z) of each pixel PX that is inputted to the comparison unit 8. Here, the grayscale value of each pixel PX may include the grayscale value x of a blue sub-pixel Bp, the grayscale value y of a green sub-pixel Gp, and the grayscale value z of a red sub-pixel Rp.

The comparison unit 8 may calculate the difference between the grayscale value x of the blue sub-pixel Bp and the grayscale value y of the green sub-pixel Gp and the difference between the grayscale value y of the green sub-pixel Gp and the grayscale value z of the red sub-pixel Rp from the grayscale value DATA (x, y, z) of each pixel PX.

The comparison unit 8 may determine that the corresponding pixel is a pixel requiring compensation for luminance deviation if the grayscale value y of the green sub-pixel Gp is greater than the grayscale value x of the blue sub-pixel Bp by a preset value or more, or if the grayscale value z of the red sub-pixel Rp is greater than the grayscale value y of the green sub-pixel Gp by the preset value or more.

In an example, assuming that the preset value is a grayscale value of 224, if the grayscale value of any one pixel is DATA (0, 236, 0), the grayscale value y of the green sub-pixel Gp is greater than the grayscale value x of the blue sub-pixel Bp by a grayscale value of 236. Thus, the comparison unit 8 may determine that the one pixel is a pixel requiring compensation for luminance deviation.

In an example, if the grayscale value of any one pixel is DATA (0, 243, 56), the grayscale value y of the green sub-pixel Gp is greater than the grayscale value x of the blue sub-pixel Bp by a grayscale value of 243. Thus the comparison unit 8 may determine that the one pixel is a pixel requiring compensation for luminance deviation.

Although, in the present specification, a description is made on the assumption that the preset value is a grayscale value of 224, embodiments of the present invention are not limited thereto, and the preset value may be changed to various values.

The control signal generation unit 9 may generate and output a clock signal HCLK that is a signal for controlling the start of input of a data signal. The clock signal HCLK may include a clock signal HCLK1 that is outputted in a normal mode and a clock signal HCLK2 that is outputted in a luminance compensation mode.

Figure 6:
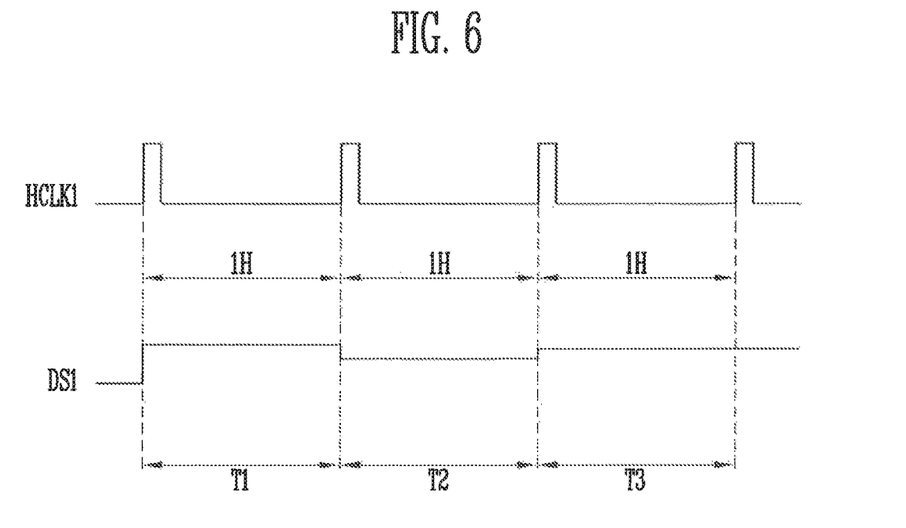
FIGS. 6 to 9 are diagrams illustrating examples of a waveform of a clock signal generated by the luminance compensation unit illustrated in FIG. 5 and a data signal supplied in response to the clock signal.

FIG. 6 illustrates an example of the clock signal HCLK1 that is outputted in the normal mode.

Referring to FIG. 6, the clock signal HCLK1 includes an ON signal that is a high-level signal and an OFF signal that is a low-level signal, wherein the ON signal may be outputted at intervals of a preset period.

Here, the preset period may be a 1 horizontal time period (1H). The 1 horizontal time period (1H) may denote a period during which a single gate signal is outputted when the clock signal HCLK is outputted in a normal mode.

In detail, the 1 horizontal time period may mean a time period from the time at which an i-th gate signal is outputted to the time at which an i+1-th gate signal is outputted.

Whenever the ON signal of the clock signal HCLK1 is outputted, a data signal may be supplied to a sub-pixel positioned on the corresponding horizontal line. For example, the ON signal, when applied through a gate line connected to the sub-pixel may turn on a transistor in the sub-pixel that enables the sub-pixel to receive the data signal through a data line.

For example, when a first grayscale value DATA (100, 54, 80) (e.g., blue sub-pixel Bp is set to receive the 100 grayscale, green sub-pixel Gp is set to receive 54 grayscale, and red sub-pixel Rp is set to receive the 80 grayscale) is supplied to any one pixel, the difference between the grayscale value x of the blue sub-pixel Bp and the grayscale value y of the green sub-pixel Gp is less than a grayscale value of 224, and the difference between the grayscale value y of the green sub-pixel Gp and the grayscale value z of the red sub-pixel Rp is less than the grayscale value of 224, and thus the clock signal HCLK1 that is outputted in the normal mode may be generated.

That is, as illustrated in FIG. 6, during a first period T1, a data signal having a grayscale value of 100 may be applied to the blue sub-pixel Bp coupled to an i-1-th gate line Gi-1 through the first data line D1. During a second period T2, a data signal having a grayscale value of 54 may be applied to the green sub-pixel Gp coupled to an i-th gate line Gi through the first data line D1. During a third period T3, a data signal having a grayscale value of 80 may be applied to the red sub-pixel Rp coupled to an i+1-th gate line Gi+1 through the first data line D1.

Here, the first to third periods T1 to T3 may be identified by the ON signal of the clock signal HCLK1. For example, the first ON signal of the clock signal HCLK1 occurs during the first period T1, the second ON signal of the clock signal HCLK2 occurs the second period T2, etc.

That is, since the ON signal of the clock signal HCLK1 is outputted at intervals of 1 horizontal time period (1H) in the normal mode, the lengths of the first to third periods T1 to T3 may be identical to each other.

In other words, a time period during which a data signal is charged in sub-pixels SPX coupled to the i-1-th gate line Gi-1, a time period during which a data signal is charged in sub-pixels SPX coupled to the i-th gate line Gi, and a time period during which a data signal is charged in sub-pixels SPX coupled to the i+1-th gate line Gi+1 may be identical to each other.

Next, the comparison unit 8 (e.g., a comparator) determines the results of calculation of the difference between the grayscale value x of the blue sub-pixel Bp and the grayscale value y of the green sub-pixel Gp and the difference between the grayscale value y of the green sub-pixel Gp and the grayscale value z of the red sub-pixel Rp from the grayscale value DATA (x, y, z) of any one pixel. In detail, as a result of the calculation, if the grayscale value y of the green sub-pixel Gp is greater than the grayscale value x of the blue sub-pixel Bp by a preset value or more or if the grayscale value z of the red sub-pixel Rp is greater than the grayscale value y of the green sub-pixel Gp by the preset value or more, the control signal generation unit 9 generates and outputs a clock signal HCLK2 differing from the clock signal HCLK1 illustrated in FIG. 6.

Figure 7:
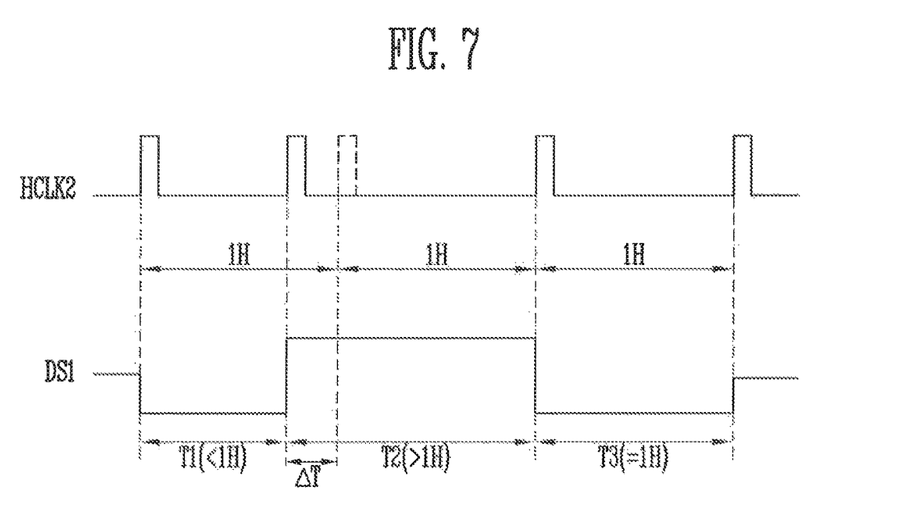

For example, when a second grayscale value DATA (0, 236, 0) is supplied to the pixel coupled to the i-1-th to i+1-th gate lines Gi-1 to Gi+1, the control signal generation unit 9 (e.g., a signal generator) may output the clock signal HCLK2, such as that illustrated in FIG. 7.

Referring to FIG. 7, the clock signal HCLK2 includes an ON signal that is a high-level signal and an OFF signal that is a low-level signal, wherein the ON signal may be non-periodically outputted. Whenever the ON signal of the clock signal HCLK2 is outputted, a data signal is supplied to a sub-pixel positioned on the corresponding horizontal line.

During a first period T1, a data signal having a grayscale value of 0 is applied to the blue sub-pixel Bp coupled to an i-1-th gate line Gi-1 through the first data line D1. During a second period T2, a data signal having a grayscale value of 236 is applied to the green sub-pixel Gp coupled to an i-th gate line Gi through the first data line D1. During a third period T3, a data signal having a grayscale value of 0 is applied to the red sub-pixel Rp coupled to an i+1-th gate line Gi+1 through the first data line D1.

Here, the first to third periods T1 to T3 may be identified by the ON signal of the clock signal HCLK2.

Referring to FIG. 7, after a first ON signal of the clock signal HCLK2 has been outputted, a second ON signal is outputted before a 1 horizontal time period (1H) elapses.

Accordingly, the first period T1 becomes shorter than the 1 horizontal time period (1H), and the second period T2 becomes longer than the 1 horizontal time period (1H).

A time period (e.g., T1) during which the data signal is charged in the blue sub-pixel Bp coupled to the i-1-th gate line Gi-1 is shortened, and a time period (e.g., T2) during which the data signal is charged in the green sub-pixel Gp coupled to the i-th gate line Gi is lengthened.

That is, the control signal generation unit 9 may control an interval between the ON signals of the clock signal so that the charging time of the data signal corresponding to a high grayscale value is further lengthened. In an embodiment, the high grayscale is greater than 90% the maximum displayable grayscale.

The control signal generation unit 9 may perform control such that the ON signal of the clock signal HCLK to be outputted at intervals of a 1 horizontal time period (1H) is outputted earlier or later by a charging time variation ΔT.

The charging time variation ΔT may be changed depending on the difference between grayscale values. For example, as the difference between the values of y and x (or z and y) becomes smaller, the charging time variation ΔT is decreased, whereas as the difference between the values of y and x (or z and y) becomes larger, the charging time variation ΔT is increased.

Here, the charging time variation ΔT may be adjusted within a range in which a minimum data charging time is guaranteed.

Referring to FIG. 7, the second period T2 may be increased to the same degree by which the first period T1 is decreased from the 1 horizontal time period (1H), and the third period may be identical to the 1 horizontal time period (1H). That is, the time period during which the data signal is applied to each pixel PX may be maintained for 3 horizontal time periods (3H).

Figure 8:
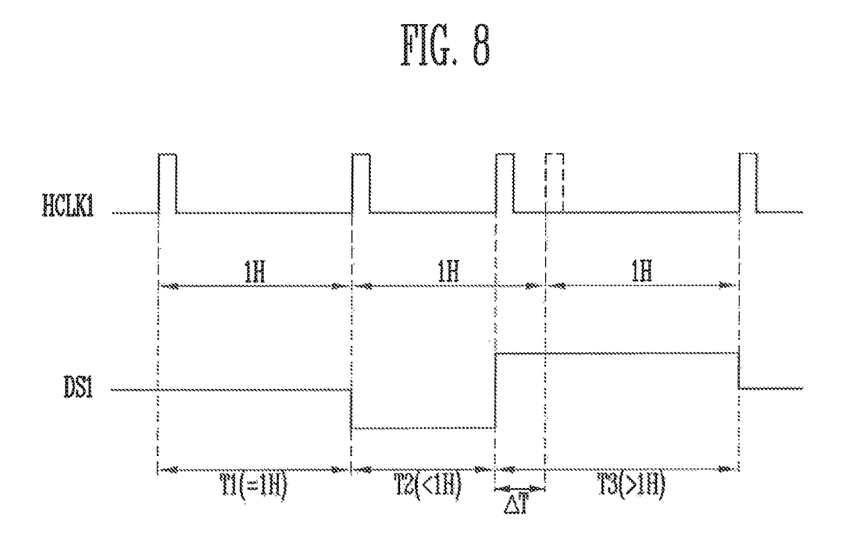
Figure 9:
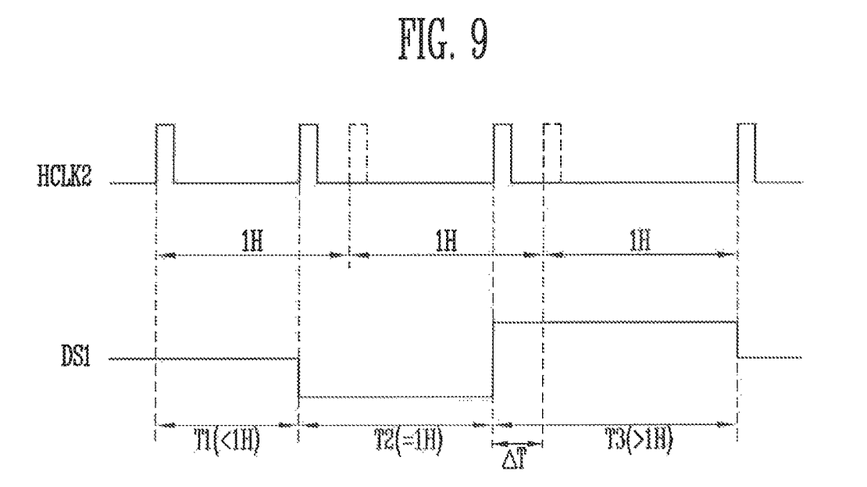

In an example, when a third grayscale value DATA (56, 0, 236) is supplied to the pixel coupled to the i−1-th to i+1-th gate lines Gi−1 to Gi+1, the control signal generation unit 9 (e.g., a signal generator) may output the clock signal HCLK2, such as that illustrated in FIG. 8 or 9. For example, since the grayscales of both the blue and green sub-pixels are significantly lower than the grayscale of the red sub-pixel, the charging period of either the blue or the green sub-pixel is shortened by a certain duration that is added to the charging period of the red sub-pixel.

Referring to FIG. 8, the clock signal HCLK2 includes an ON signal that is a high-level signal and an OFF signal that is a low-level signal, wherein the ON signal may be non-periodically outputted. Whenever the ON signal of the clock signal HCLK2 is outputted, a data signal is supplied to a sub-pixel positioned on the corresponding horizontal line.

During a first period T1, a data signal having a grayscale value of 56 is applied to the blue sub-pixel Bp coupled to an i−1-th gate line Gi−1 through the first data line D1. During a second period T2, a data signal having a grayscale value of 0 is applied to the green sub-pixel Gp coupled to an i-th gate line Gi through the first data line D1. During a third period T3, a data signal having a grayscale value of 236 is applied to the red sub-pixel Rp coupled to an i+1-th gate line Gi+1 through the first data line D1.

Here, the first to third periods T1 to T3 may be identified by the ON signal of the clock signal HCLK2.

Referring to FIG. 8, after the second ON signal of the clock signal HCLK2 has been outputted, a third ON signal is outputted before a 1 horizontal time period (1H) elapses (i.e., the second 1H period).

Accordingly, the second period T2 becomes shorter than the 1 horizontal time period (1H), and the third period T3 becomes longer than the 1 horizontal time period (1H).

A time period during which the data signal is charged in the green sub-pixel Gp coupled to the i-th gate line Gi is shortened, and a time period during which the data signal is charged in the red sub-pixel Rp coupled to the i+1-th gate line Gi+1 is lengthened. Here, the first period T1 may be identical to the 1 horizontal time period (1H).

Unlike this configuration, as illustrated in FIG. 9, the first period T1 becomes shorter than the 1 horizontal time period (1H).

That is, after a first ON signal of the clock signal HCLK2 has been outputted, a second ON signal is outputted before the 1 horizontal time period (1H) elapses.

Accordingly, the first period T1 becomes shorter than the 1 horizontal time period (1H). Next, after the 1 horizontal time period (1H) has elapsed from the output of the second ON signal, a third ON signal is outputted. That is, the second period T2 is identical to the 1 horizontal time period (1H), and the third period T3 becomes longer than the 1 horizontal time period (1H).

A time period during which the data signal is charged in the blue sub-pixel Bp coupled to the i−1-th gate line Gi−1 is shortened, and a time period during which the data signal is charged in the red sub-pixel Rp coupled to the i+1-th gate line Gi+1 is lengthened.

As in a case where luminance corresponding to the second grayscale value DATA (0, 236, 0), described above by way of example, is represented, when a data signal corresponding to a high grayscale value is applied after a data signal corresponding to a low grayscale value has been applied, the data signal corresponding to the high grayscale value may not be sufficiently charged in a sub-pixel, thus resulting in a problem in which desired luminance cannot be represented.

A data signal including a value greater than a grayscale value contained in an image signal can be applied to solve the above-described problem. However, a problem arises in that a charging rate is insufficient even if the maximum grayscale value is inputted when the difference between a low grayscale value and a high grayscale value is a preset value (e.g., 224) or more. In an embodiment, the preset value is >=90% a maximum displayable luminance.

In accordance with an exemplary embodiment of the present invention, data signals may be sufficiently charged by lengthening a time period during which a data signal corresponding to a high grayscale value is to be charged.

In accordance with the present disclosure, an LCD having improved luminance uniformity may be provided.

Although exemplary embodiments of the present inventive concept have been described for illustrative purposes, various modifications, additions and substitutions are possible, without departing from the scope and spirit of the inventive concept.

What is claimed is:

1. A display device, comprising:
   a plurality of pixels, each including a first sub-pixel indicating a first color, a second sub-pixel indicating a second color, and a third sub-pixel indicating a third color;
   a plurality of data lines coupled to the pixels arranged in a first direction and configured to supply a data signal to the coupled pixels;
   a plurality of gate lines coupled to the pixels arranged in a second direction crossing the first direction and configured to supply a gate signal to the coupled pixels; and
   a compensation circuit configured to calculate a difference between grayscale values of a data signal to be supplied to the first to third sub-pixels, generate a clock signal based on the difference, and apply the clock signal to a data driver to control a start time at which the data driver inputs the data signal to the pixels.

2. The display device according to claim 1, wherein the first sub-pixel is coupled to an i−1-th gate line among the gate lines, the second sub-pixel is coupled to an i-th gate line among the gate lines, and the third sub-pixel is coupled to an i+1-th gate line among the gate lines, where i is a natural number greater than 0.

3. The display device according to claim 1, wherein the first sub-pixel, the second sub-pixel, and the third sub-pixel are coupled to a same one of the data lines.

4. The display device according to claim 1, wherein the compensation circuit comprises:
a comparator configured to calculate differences between a first grayscale value of a data signal to be supplied to the first sub-pixel, a second grayscale value of a data signal to be supplied to the second sub-pixel, and a third grayscale value of a data signal to be supplied to the third sub-pixel; and
a signal generator configured to generate the clock signal based on the differences.

5. The display device according to claim 4, wherein, when the second grayscale value is greater than the first grayscale value by a preset value or more, a charging time of the data signal supplied to the first sub-pixel is shorter than 1 horizontal time period, and a charging time of the data signal supplied to the second sub-pixel is longer than the 1 horizontal time period.

6. The display device according to claim 5, wherein a charging time of the data signal supplied to the third sub-pixel has a length corresponding to the 1 horizontal time period.

7. The display device according to claim 4, wherein, when the third grayscale value is greater than the second grayscale value by a preset value or more, a charging time of the data signal supplied to the third sub-pixel is longer than 1 horizontal time period, and a charging time of the data signal supplied to at least one of the first sub-pixel and the second sub-pixel is shorter than the 1 horizontal time period.

8. The display device according to claim 7, wherein a charging time of a data signal supplied to each pixel has a length corresponding to 3 horizontal time periods.

9. The display device according to claim 4, wherein: the clock signal comprises ON signals, and the signal generator is configured to adjust an interval between the ON signals of the clock signal based on the differences.

10. The display device according to claim 9, wherein the signal generator is configured to: when the data signal is supplied to the pixels in a normal mode, output the ON signals of the clock signal at intervals of 1 horizontal time period, and when the data signal is supplied to the pixels in a luminance compensation mode, output at least one of the ON signals before the 1 horizontal time period elapses.

11. The display device according to claim 10, wherein the comparator is configured to determine that a current mode is the luminance compensation mode if the second grayscale value is greater than the first grayscale value by a preset value or more, or if the third grayscale value is greater than the second grayscale value by the preset value or more.

12. The display device according to claim 11, wherein: when, among the ON signals of the clock signal, an i−1-th ON signal is outputted, the first grayscale value is charged in the first sub-pixel, when an i-th ON signal is outputted, the second grayscale value is charged in the second sub-pixel, and when an i+1-th ON signal is outputted, the third grayscale value is charged in the third sub-pixel, and as a difference between the second grayscale value and the first grayscale value becomes larger, a time at which the i-th ON signal is outputted becomes earlier, where i is a natural number greater than 1.

13. The display device according to claim 12, wherein the i+1-th ON signal is outputted after 2 horizontal time periods have elapsed from a time at which the i−1-th ON signal is outputted.

14. The display device according to claim 12, wherein, when the third grayscale value is greater than the second grayscale value by the preset value or more, the i+1-th ON signal is outputted before 1 horizontal time period elapses from the time at which the i-th ON signal is outputted.

15. The display device according to claim 12, wherein, when the third grayscale value is greater than the second grayscale value by the preset value or more, the i-th ON signal is outputted before 1 horizontal time period elapses from a time at which the i−1-th ON signal is outputted.

16. A display driving apparatus for driving a display device comprising a pixel including first and second sub-pixels connected to a data line, the display driving apparatus comprising:
a compensation circuit configured to set a first duration between first and second pulses of a clock signal to a horizontal period preset when a first difference between a first grayscale to be applied to the first sub-pixel and a second grayscale to be applied to the second sub-pixel is less than a preset value, and set the first duration less than the horizontal period when the first difference is greater than or equal the preset value; and
a data driver configured to apply a first data signal based on the first grayscale to the data line in response to the first pulse and apply a second data signal based on the second grayscale to the data line in response to the second pulse.

17. The display driving apparatus of claim 16, wherein the first sub-pixel is configured to emit light of a first color and the second sub-pixel is configured to emit light of a second color different from the first color.

18. The display driving apparatus of claim 17, wherein the first sub-pixel is connected to a first gate line and the second sub-pixel is connected to a second gate line, wherein the horizontal period is a time period from the time at which a first gate signal is outputted to the time at which a second gate signal is output to the second gate line.

19. The display driving apparatus of claim 17, wherein the pixel comprises a third sub-pixel connected to the data line, wherein the compensation circuit is configured to set a second duration between the second pulse and a third pulse of the clock signal greater than the one horizontal period when a second difference between the second grayscale and a third grayscale is greater than or equal the preset value, and wherein the data driver is configured to apply a third data signal based on the third grayscale to the data line in response to the third pulse.

20. The display driving apparatus of claim 19, wherein the third sub-pixel is configured to emit light of a third color different from the first and second colors.

* * * * *